United States Patent [19]

Brownell et al.

[11] 3,925,739

[45] Dec. 9, 1975

[54] RADIO FREQUENCY NOTCH FILTER

[75] Inventors: Dudley C. Brownell, Glen Arm; Harold W. Jackson, Towson, both of Md.

[73] Assignee: The Bendix Corporation, Southfield, Mich.

[22] Filed: Oct. 2, 1974

[21] Appl. No.: 511,150

[52] U.S. Cl. .................................... 333/76; 333/78

[51] Int. Cl.² .... .................. H03H 7/10; H03H 7/14

[58] Field of Search .......... 333/75, 76, 77, 78, 70 R

[56] References Cited

UNITED STATES PATENTS

| | | | |
|---|---|---|---|
| 2,574,259 | 11/1951 | Goldberg | 333/75 X |
| 3,396,341 | 8/1968 | Fange | 333/76 X |
| 3,519,737 | 7/1970 | Marsh, Jr. | 333/76 |

*Primary Examiner*—James W. Lawrence
*Assistant Examiner*—Marvin Nussbaum
*Attorney, Agent, or Firm*—W. G. Christoforo; Bruce L. Lamb

[57] ABSTRACT

A radio frequency notch filter includes a transformer secondary winding connected in series with a transmission line. The transformer primary winding is arranged with a capacitor to be parallel resonant at the filter center frequency. A reactive means is also connected in electrical shunt with the transmission line which responds at the notch frequency to drain current then traversing the secondary winding.

3 Claims, 4 Drawing Figures

RADIO FREQUENCY NOTCH FILTER

BACKGROUND OF THE INVENTION

This invention relates to radio frequency notch filters and more particularly to double tuned radio frequency notch filters.

A simple radio frequency notch filter, as well known in the art, is comprised of a capacitor in parallel connection with an inductor, with the resultant filter designed to be parallel resonant at the notch frequency and connected in series in a R.F. transmission line. A problem with this type of filter is that the inductor has a real or resistive impedance portion which allows current to flow therethrough even at the notch frequency thus limiting the depth of the filter notch or, in other words, limiting the filter attenuating at the notch frequency. One means for eliminating this undesirable current component is comprised simply of a resistor connected between a center tap of the filter inductor and the transmission line signal return terminal. In this case, the inductor operates as an inverting transformer with the undesired current flowing in the first portion and an equal opposite current flowing in the second portion to compensate for the undesired current. The combined currents flow into the return terminal through the added resistor. This solution is not entirely satisfactory because the resistor causes loading of the circuit at frequencies within the desired passband.

A second solution is comprised of an inductor and capacitor connected in series between the filter inductor center tap and the signal return terminal, with the second inductor and capacitor being designed to be series resonant at the filter notch frequency. In this case, the series resonant circuit presents a low inpedance at the notch frequency and thus permits the undesired current to be compensated for at that frequency. However, at frequencies outside the notch, the series resonant circuit presents a relatively high impedance and there is no current compensation with the result that the signal generator is not loaded undesirably. Of course, at frequencies outside the notch, there is no need to compensate for the undesired current.

BRIEF SUMMARY OF THE INVENTION

It is found that in the R.F. band of frequencies it is impossible to realize a notch filter of the type described above under certain circumstances because the required parallel capacitor is too large to be practically realized, while the parallel inductor is too small to be realized. Accordingly, the present invention comprises an adaptation of the above described radio frequency notch filter wherein the previous parallel inductor is replaced by the secondary winding of a transformer with the series resonant circuit being connected between the center tap of the secondary winding and the current return terminal and with the primary winding of the transformer being arranged to be parallel resonant with the capacitor.

It is thus an object of this invention to provide a realizable radio frequency notch filter which provides relatively high attenuation at the notch frequency and which does not present an excessive transmission line load at frequencies outside the notch frequency.

BRIEF DESCRIPTION OF THE DRAWINGS

FIG. 2 is the schematic of another embodiment of the invention.

DESCRIPTION OF THE PREFERRED EMBODIMENT

Figure 1:
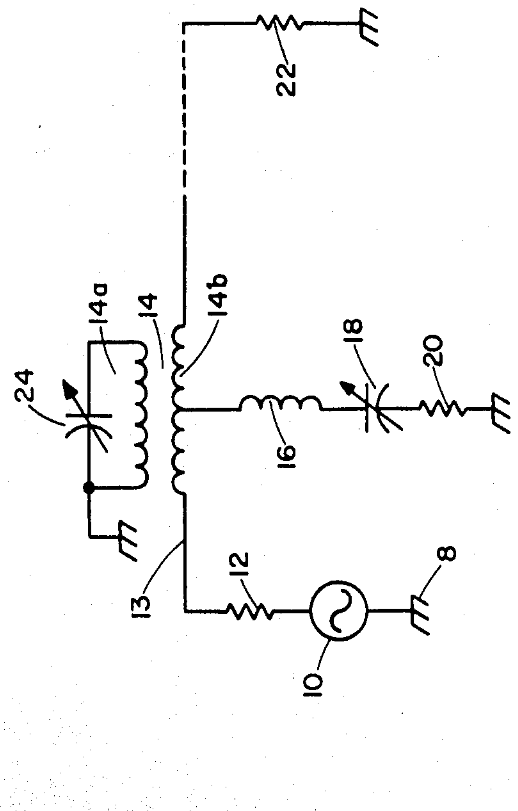
FIG. 1 is a schematic of the invention.

In FIG. 1, a signal generator 10 having a source impedance represented by resistor 12 is connected between a transmission line 13 and a current return terminal designated for the purposes of this description as ground 8. A load represented by resistor 22 is connected between transmission line 13 and the ground return terminal. A transformer 14 has a primary winding 14a and a secondary winding 14b connected in series with transmission line 13 between the signal generator and the load. A center tap of secondary winding **14*b* is connected to the ground return terminal through the series arrangement of inductor 16 and capacitor 18, with a resistor 20 presenting the real impedance portion of inductor 16. Inductor 16 and capacitor 18** are chosen to be series resonant at the filter notch frequency.

Primary winding **14*a* is arranged in parallel with a capacitor 24 which is selected to cooperate with winding 14*a* to be parallel resonant at the notch frequency. One common terminal of winding 14*a*** and capacitor 24 is connected to the current return terminal.

Figure 2:
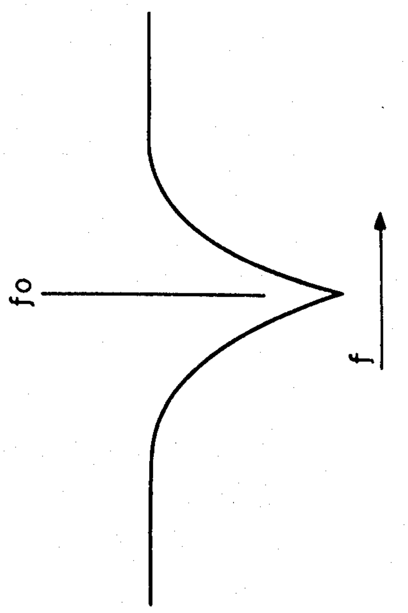
FIG. 2 is a plot of the response of a typical notch filter.

The operation of the circuit of FIG. 1 will be explained with reference to FIG. 2 wherein the conductivity of the filter is plotted against frequency with the notch frequency being designated $f_0$. With the frequency of the signal of transmission line 13 outside the band of the notch filter, neither the parallel circuit comprised of primary winding **14*a* and capacitor 24 nor the series winding comprised of inductor 16 and capacitor 18 is resonant with the result that the conductivity through the transmission line is limited essentially only by the real portion of the impedance of secondary winding 14*b* and, in the case of a multistage filter, like impedances in series therewith, together with source impedance 12 and load 22. Note that the series circuit comprised of capacitor 18 and inductor 16 under these conditions draws practically no current, with the result that a relatively large number of filters may be cascaded without the deleterious effect of excess current being drawn from signal source 10. As the signal frequency approaches the notch frequency $f_0$, the parallel circuit comprised of winding 14*a* and capacitor 24 approaches resonance with the resulting high impedance therein being coupled to secondary winding 14*b* to present a high series impedance in transmission line 13. Simultaneously, the series circuit comprised of inductor 16 and capacitor 18 also approaches resonance with the result that the center tap of winding 14*b* approaches the potential of the ground return terminal, limited essentially only by resistance 20. In this case, winding 14*b* comprises an inverting transformer wherein that portion of the winding between the center tap and signal generator 10 comprises the primary and that portion of the winding between the center tap and load 22 comprises the secondary, oppositely poled from the primary. Thus, current flowing in the primary of the transformer comprised of winding 14*b*** is compensated for by current flowing in the secondary of the same transformer with the that at resonance no net current flows through winding 14*b* to load 22. Thus, the depth of the notch at frequency $f_0$ will be relatively deep.

Figure 3:
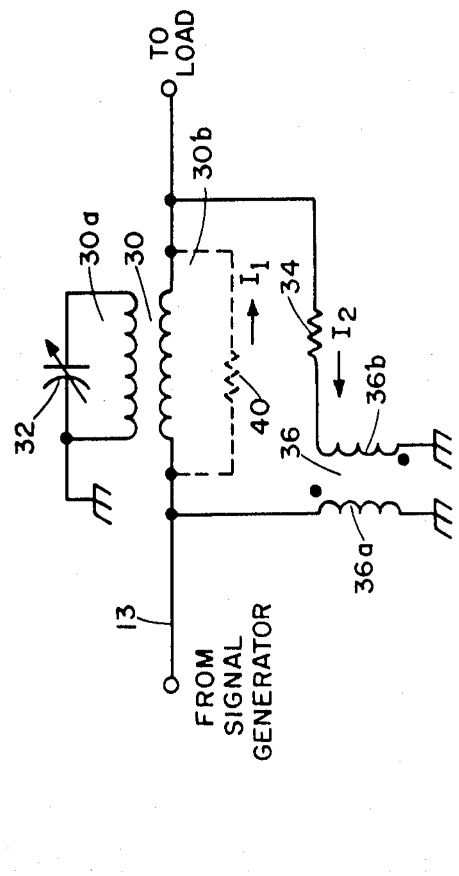

Refer now to FIG. 3 which shows another embodiment of the invention wherein a transformer 30 has a primary winding 30*a* connected in parallel to capacitor 32, the common terminal being connected to the current return path, and a secondary winding 30*b*, arranged in series with transmission line 13, and which is connected between the signal generator and the load similar to that shown in FIG. 1. A second transformer 36 has a primary winding 36*a* connected between one end of the winding 30*b* and the current return terminal, a secondary winding 36*b* connected in series with resistor 34 between the other end of winding 30*b* and the current return terminal. Transformer 36 is preferably simply an inverter wherein the primary is oppositely poled with respect to the secondary. In this case, resistor 34 is made equal to the real portion of the impedance coupled to secondary winding 36*b* at the notch frequency. As before, the circuit comprised of primary winding 30*a* and capacitor 32 is tuned to be parallel resonant at the notch frequency, and thus to couple a relatively high impedance to secondary winding 30*b*.

Secondary winding 30b includes a real portion represented by dotted resistor 40 parallel to the secondary winding. At resonance, that is at the notch frequency, negligible current flows in the reactive portion of the equivalent circuit represented by winding 30*b* and resistor 40, while the current component $I_1$ flows in resistor 40. At the same time there is produced in secondary winding 36*b* a voltage, in this embodiment, equal and opposite to the voltage across winding 30*b* with the result that a current $I_2$ is drawn through resistor 34. For the assumed unity transformation and with resistor 34 being equal to resistor 40 $I_2$ will be equal to $I_1$ so that, as before, no net current flows into the load at the notch frequency.

Figure 4:
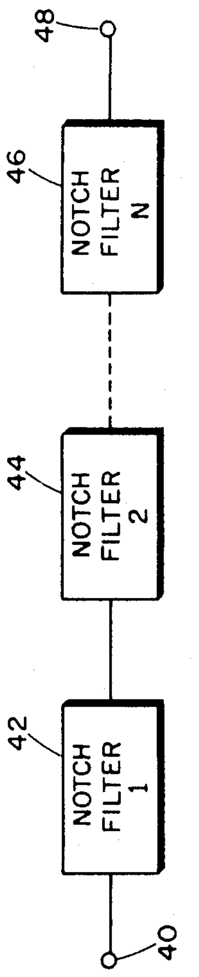
FIG. 4 shows a plurality of notch filters connected in series in a transmission line.

Refer now to FIG. 4 which shows a plurality of notch filters 42, 44 and 46 connected serially in a R.F. transmission line between an input terminal 40 and an output terminal 48. It should be understood that the notch filters shown in this figure are similar or identical to those described above. At the option of the system designer each of the notch filters can be tuned to the same notch frequency to thus enhance the sharpness of the notch. As an alternative, various notch filters or combination of notch filters can be tuned to one notch frequency and other notch filters can be tuned to other notch frequencies. In this way a plurality of notches can be provided in the spectrum of the signal transmitted from terminal 40 to terminal 48.

The invention claimed is:

1. An electrical filter network connected into a transmission line having a current return terminal for selectively attenuating at least one predetermined frequency from a signal encompassing a frequency band propagating therethrough comprising:

a transformer including a secondary winding connected in series in said transmission line and having a primary winding, said secondary winding having an intermediate tap;

means cooperating with said primary winding to be parallel resonant with said primary winding at said predetermined frequency; and, a reactive circuit connected between said current return terminal and said intermediate tap and tuned to be series resonant at said predetermined frequency to drain current traversing said secondary winding.

2. The electrical filter of claim 1 wherein said reactive circuit comprises at least an inductor and a capacitor.

3. An electrical filter network connected into a transmission line having a current return terminal for selectively attenuating at least one predetermined frequency from a signal encompassing a frequency band propagating therethrough comprising:

a transformer including a secondary winding having first and second ends and connected in series with said transmission line, said transformer also including a primary winding;

means cooperating with said primary winding to be parallel resonant with said primary winding at said predetermined frequency; and, a secpmd transformer having first and second windings oppositely poled from one another, first ends of said second transformer being connected respectively to said first and second ends of said secondary winding and second ends of said second transformer being connected to said current return terminal.

* * * * *